United States Patent [19]

Kawashima

[11] Patent Number: 4,484,382

[45] Date of Patent: Nov. 27, 1984

[54] METHOD OF ADJUSTING RESONANT FREQUENCY OF A COUPLING RESONATOR

[75] Inventor: Hirofumi Kawashima, Tokyo, Japan

[73] Assignee: Seiko Instruments & Electronics Ltd., Tokyo, Japan

[21] Appl. No.: 363,466

[22] Filed: Mar. 30, 1982

[30] Foreign Application Priority Data

May 15, 1981 [JP]   Japan .................................. 56-73245

[51] Int. Cl.³ .................................................. H01L 41/22
[52] U.S. Cl. ......................................... 29/25.35; 29/593; 310/312; 427/100
[58] Field of Search ............... 29/25.35, 593; 310/312; 427/100; 219/121 LM, 121 LJ, 121 LH

[56] References Cited

U.S. PATENT DOCUMENTS

| | | | |
|---|---|---|---|
| 2,505,370 | 4/1950 | Sykes | 310/312 |
| 3,760,471 | 9/1973 | Borner | 29/25.35 |
| 4,050,126 | 9/1977 | Ikeno et al. | 29/25.35 |

*Primary Examiner*—Carl E. Hall
*Attorney, Agent, or Firm*—Robert E. Burns; Emmanuel J. Lobato; Bruce L. Adams

[57] ABSTRACT

Each resonant frequency of a coupling resonator is measured at a plurality of each different temperatures. From these values the first order temperature coefficient $\alpha$ is calculated. According to the value of $\alpha$, it is accurately adjusted and finally the resonant frequency of a fundamental vibration is also adjusted to a nominal frequency.

13 Claims, 16 Drawing Figures

METHOD OF ADJUSTING RESONANT FREQUENCY OF A COUPLING RESONATOR

BACKGROUND OF THE INVENTION

The present invention relates to a method of adjusting the resonant frequency of a resonator having a plurality of coupled vibrational modes i.e., a so-called coupling resonator. There are many consumer products requiring resonators having excellent temperature characteristics and which use an AT cut quartz resonator. Recently, however, there has been a trend toward miniaturization of the various consumer products which in turn requires use of a miniaturized AT cut quartz resonator. In a resonator of this type the resonator exhibits a great deal of spurious vibrations and miniaturization thereof is difficult.

In particular, in the case of using the AT cut quartz resonator as a resonator for wrist watches, miniaturization is required and the resonator size is not sufficient as compared with that of a flexural quartz resonator of the tuning fork type.

Recently, therefore, a method of forming a resonator by means of a photographic process which is applied to IC (integrated circuit) production has been applied to resonator production, and as a result, it is possible to provide extremely miniaturized resonators, e.g. a GT cut quartz resonator having excellent frequency-temperature characteristics, having extremely thin thickness of the resonator and a flexural-torsional quartz resonator (called FT quartz resonator hereinafter) which couples a torsional vibration to a flexural vibration, and miniaturization has been made possible. However, in order that these GT cut and FT cut quartz resonators obtain excellent frequency-temperature characteristics, they make use of two vibrational modes, that is to say, a coupling of a fundamental vibration and a sub-vibration. Therefore, the temperature characteristics are determined by the frequency difference of the fundamental vibration and the sub-vibration and by the intensity of each vibration. In particular, as the ratio of the intensity of each vibration of the fundamental vibration and the sub-vibration is different for different resonators, the difference of the resonant frequency is also different, and it is therefore necessary to adjust the difference of the resonant frequency for each resonator. This adjustment takes much time, contributes to a high cost, and is unsuitable in mass production and therefore, may be one of the causes that the resonator of this type is not used in more fields of application.

SUMMARY OF THE INVENTION

Accordingly, it is an object of the present invention to eliminate the foregoing drawbacks, and the present invention provides a new method of adjusting the temperature characteristics and the resonant frequency of a coupling resonator.

It is another object of the present invention to provide a coupling resonator having excellent frequency-temperature characteristics (called temperature characteristics hereinafter).

In accordance with the present invention, a laser or evaporation equipment is utilized so as to adjust the resonant frequency and temperature efficients. In either case, a design of the coupling resonator having optimum temperature characteristics and optimum resonant frequency is first made before adjusting the resonant frequency, and the resonant frequencies $f_1$, $f_2$ of the fundamental vibration are respectively measured at the arbitrary temperatures $t_1$, $t_2$. On these values the first order temperature coefficient $\alpha$ is calculated, then, by utilizing the laser or evaporation equipment, the first order temperature coefficient $\alpha$ is adjusted to approximately zero and thereafter, the resonant frequency of the fundamental vibration is also adjusted to the nominal frequency $f_0$. As a result, it is possible to provide the GT cut quartz resonator having excellent temperature characteristics. Therefore, the GT cut quartz resonator makes it possible to realize high accuracy wrist watches. As the first order temperature coefficient is adjusted after measuring the temperature characteristics of each resonator in these methods, the percent of resonators having defective temperature characteristics is remarkably reduced. These methods, therefore, make it possible to keep the cost down. These and other objects of the invention will become more apparent from a reading of the detailed description and examples which follows.

BRIEF DESCRIPTION OF THE DRAWINGS

In the accompanying drawings:

FIGS. 1(A) and 1(B) show a front view and a bottom view respectively.

FIGS. 2(A) and 2(B) show a front view and a bottom view respectively.

DESCRIPTION OF THE EMBODIMENT

Figure 1A:
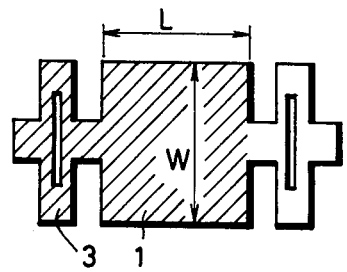
FIGS. 1(A) and 1(B) show an embodiment of a shape and electrodes of a coupling resonator reduced to practical use of the present invention, e.g., the embodiment of a GT cut quartz resonator.
Figure 1B:
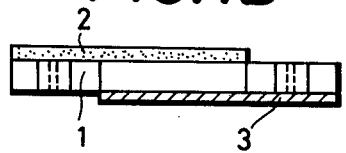

FIGS. 1(A) and 1(B) show an embodiment of a shape and electrodes of the coupling resonator reduced to practical use of the present invention, e.g., the embodiment of a GT cut quartz resonator. FIGS. 1(A) and 1(B) show a front view and a bottom view respectively. The electrodes 2 and 3 are disposed on obverse and reverse major surfaces of a quartz 1, and it is possible to easily excite the resonator, by applying an alternating voltage to both electrodes. Moreover, the resonant frequencies of the two vibrational modes are determined by the width W and the length L, and the resonant frequency of the fundamental vibration determined by the width W is called $f_W$, and the resonant frequency of the sub-vibration determined by the length L is called $f_L$, and the temperature characteristics are determined by the difference of both resonant frequencies ($f_W-f_L$) and the intensity of vibrations of the fundamental vibration and the sub-vibration.

Figure 2A:
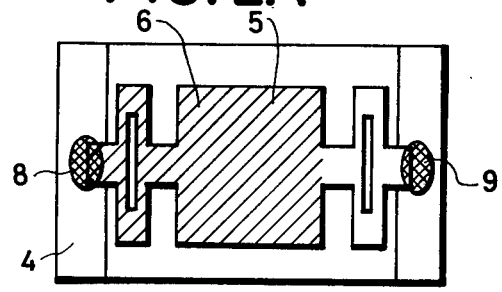
FIGS. 2(A) and 2(B) show an embodiment of the GT cut quartz resonator mounted on a pedestal reduced to practical use of the present invention.
Figure 2B:
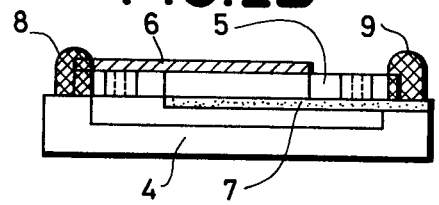

FIGS. 2(A) and 2(B) show an embodiment of the GT cut quartz resonator mounted on a pedestal reduced to practical use of the present invention. FIGS. 2(A) and 2(B) show a front view and a bottom view respectively. The quartz resonator 5 is disposed on a pedestal 4 and adhered to the pedestal by adhesives or solder at the end portions 8, 9. The electrodes 6, 7 for exciting the GT cut quartz resonator are disposed on the obverse and the reverse major surfaces of the quartz plate.

Figure 3:
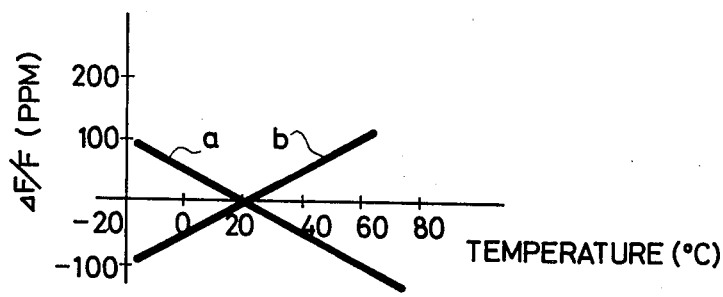
FIG. 3 shows an embodiment of the temperature characteristics of the GT cut quartz resonator formed by a photolithographic process of the present invention.

FIG. 3 shows an embodiment of the temperature characteristics of the GT cut quartz resonator formed by a photolithographic process of the present invention, on which a weight for adjusting the resonant frequency is not disposed. The temperature characteristics differ by the coupling intensity, for example when the coupling between the fundamental vibration and sub-vibration is weak, the temperature characteristics are shown like a straight line a, and when the coupling between them is strong, they are shown like a straight line b. The absolute value of the first order temperature coefficient $\alpha$ is approximately $2.5\times10^{-6}/°C.$, which is too large for practical use and their straight lines do not show excellent temperature characteristics. In general, the resonator formed by the photolithographic process has such temperature characteristics. In case of adjusting the resonant frequency of the fundamental vibration by using a laser equipment, beforehand weights are disposed on the resonator, though in this case the value of the first order temperature coefficient $\alpha$ is somewhat different, but shows almost the same value and the same tendency.

Figure 4:
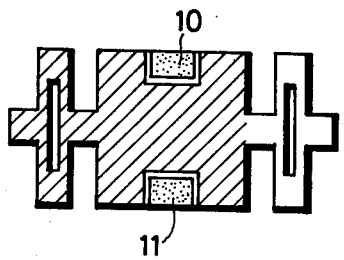
FIG. 4 shows a front view of an embodiment of weights disposed on the GT cut quartz resonator of the present invention.

FIG. 4 shows an embodiment of the GT cut quartz resonator of the present invention on which weights are disposed, the weights 10, 11 being disposed on the resonator at the end portions in the width direction and the central portions in the length direction to the symmetry from a central portion of a vibrational portion. As shown in FIG. 4, the weights 10,11 are disposed midway along the marginal edge portions of the vibrational portion of the resonator. The thickness of the weights is between about 1 $\mu m$ and 2 $\mu m$.

Figure 5:
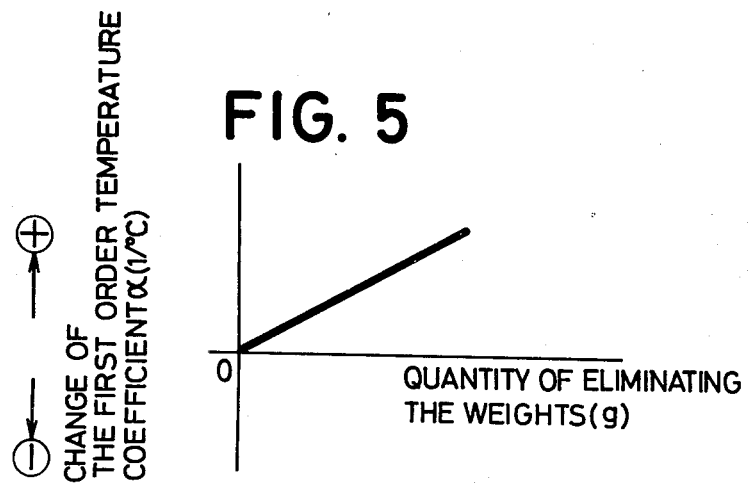
FIG. 5 shows the relationship between a change of the quantity of eliminating weights and the first order temperature coefficient $\alpha$, when the weights shown in FIG. 4 are eliminated by the laser equipment.

FIG. 5 shows the relationship between a change of quantity of eliminating weights and the first order temperature coefficient $\alpha$, when the weights 10, 11 shown in FIG. 4 are eliminated by the laser equipment. That is to say, according to increase quantity of eliminating the weight, i.e., increasing weight removal, the first order temperature coefficient $\alpha$ shifts to a positive value.

Figure 6:
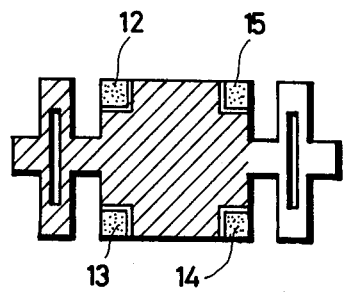
FIG. 6 shows a front view of an example of weights disposed on the four corners of the GT cut quartz resonator of the present invention.

FIG. 6 show an embodiment of the GT cut quartz resonator having four weights 12, 13, 14, 15 at the four corners of the vibrational portion of the resonator.

Figure 7:
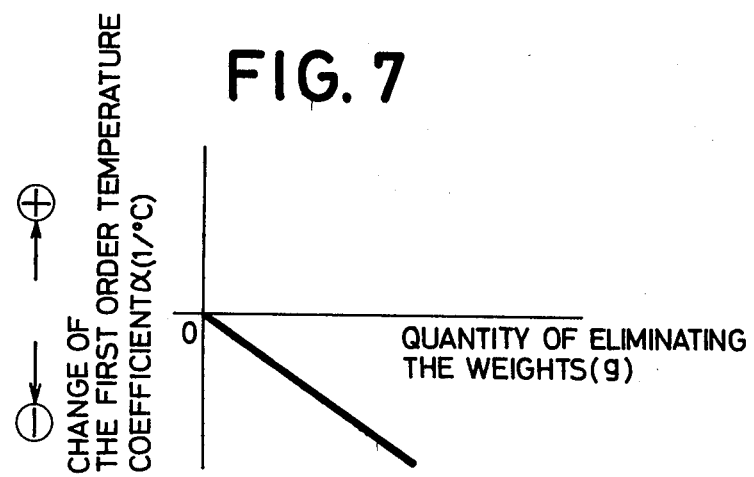
FIG. 7 shows the relationship between a change of the quantity of eliminating weights and the first order temperature coefficient $\alpha$, when the four weights shown in FIG. 6 are eliminated by making use of the laser equipment.

FIG. 7 shows the relationship between a change of quantity of eliminating weights and the first order temperature coefficient $\alpha$, when the four weights 12, 13, 14, 15 shown in FIG. 6 are eliminated by making use of the laser equipment. According to increase quantity of eliminating the weights, the first order temperature coefficient $\alpha$ shifts to a negative value.

Figure 8:
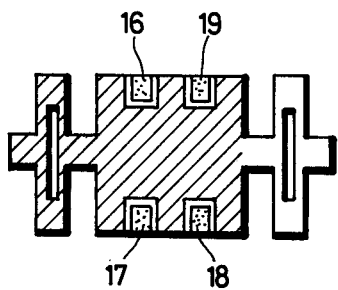
FIG. 8 shows a front view of another example of the disposition of weights of the GT cut quartz resonator according to the present invention.

As understood from these results, in the case of the disposition of weights shown in FIG. 4, the first order temperature coefficient $\alpha$ shifts to the positive value, by eliminating the weights, on the other hand, in the case of the disposition of weights shown in FIG. 6, the first order temperature coefficient $\alpha$ shifts to the negative value, by eliminating the weights. If, weights are disposed in the region between the weights 10, 11 shown in FIG. 4 and the weights 12, 13, 14, 15 shown in FIG. 6, and when eliminating the weights, it is possible to forecast that the first order temperature coefficient $\alpha$ does not shift at all. FIG. 8 shows a front view of another example of disposition of weights of the the GT cut quartz resonator according to the present invention.

The weights 16, 19 are disposed between the weight 10 shown in FIG. 4 and the weights 12, 15 shown in FIG. 6, and the weights 17, 18 are disposed between the weight 11 and the weights 13, 14.

Figure 9:
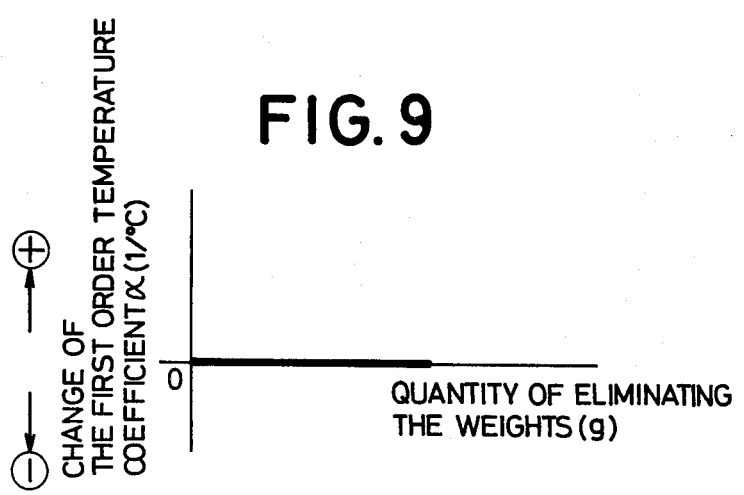
FIG. 9 shows the relationship between a change of the quantity of eliminating the weights and the first order temperature coefficient $\alpha$, when the weights shown in FIG. 8 are eliminated by the laser equipment.

FIG. 9 shows the relationship between a change of quantity of eliminating the weights and the first order temperature coefficient $\alpha$, as the weights 16, 17, 18, 19 shown in FIG. 8 are eliminated by the laser equipment, and by eliminating the weights, it is understood that the first order temperature coefficient $\alpha$ does not shift at all.

Figure 10:
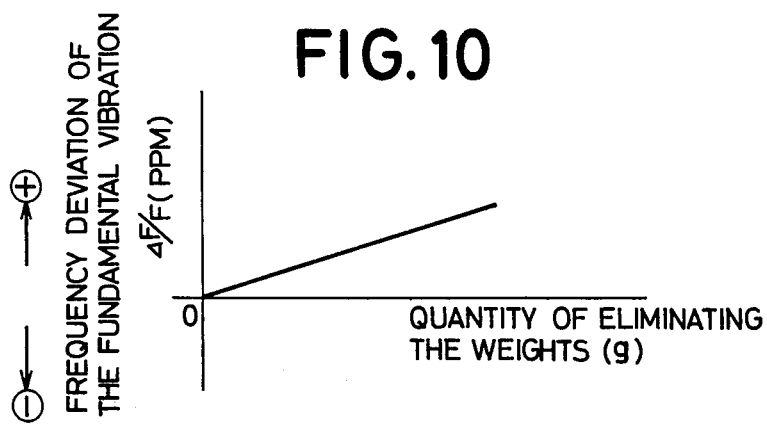
FIG. 10 shows a change of the resonant frequency of the fundamental vibration versus quantity of eliminating the weights, as the weights shown in FIG. 8 are eliminated by the laser equipment.

FIG. 10 shows a change of the resonant frequency of the fundamental vibration versus quantity of eliminating the weights, as the weights 16, 17, 18, 19 shown in FIG. 8 are eliminated by the laser equipment, and also it is understood that the resonant frequency of the fundamental vibration becomes higher according to increase quantity of eliminating the weights.

Figure 11:
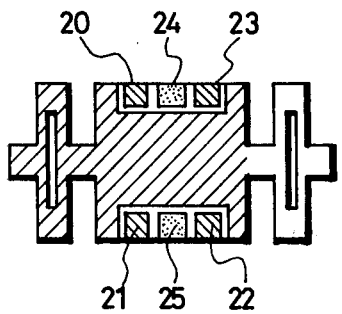
FIG. 11 show a front view of an example reduced to practical use of weights disposed so as to obtain excellent temperature characteristics of the GT cut quartz resonator of the present invention, by means of adjusting the resonant frequency.

FIG. 11 shows an example of weights disposed so as to obtain excellent temperature characteristics of the GT cut quartz resonator of the present invention and which are disposed for adjusting the resonant frequency. The weights 24, 25 are those for adjusting the temperature characteristics and the weights 20, 21, 22, 23 are those for adjusting the resonant frequency of the fundamental vibration. The method of adjusting the frequency will now be explained. As the GT cut quartz resonator shown in FIG. 11 is formed by the photolithographic process, it is designed as follows: (1) The first order temperature coefficient $\alpha$ has a negative value, that is to say, as the temperature rises the resonant frequency lowers. (2) The resonant frequency of the fundamental vibration is lower than the nominal frequency to be adjusted.

Such a resonator is easily obtained by choosing the shape, quantity of weights, and etching hours.

Figure 12:
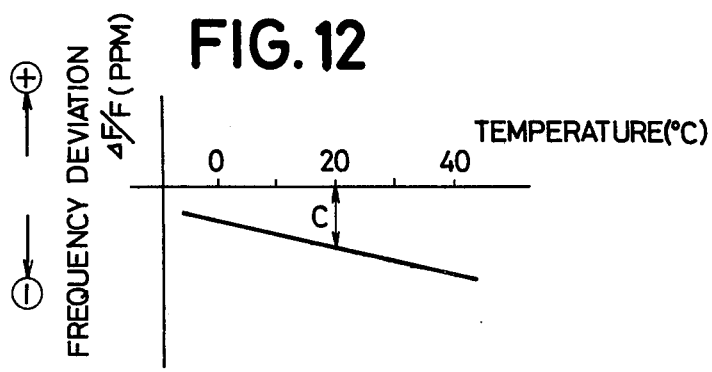
FIG. 12 shows an example of temperature characteristics of a resonator measured before adjusting the resonant frequency and after the resonator is formed by etching.

FIG. 12 shows temperature characteristics of a resonator measured after being formed by etching. An arrow C shows the deviation quantity from the nominal frequency, and the resonant frequency of the resonator is lower than the nominal frequency. This resonator is set at an arbitrary temperature, this temperature is read by a thermometer, and the measured temperature is denoted $t_1$, and then the resonant frequency $f_1$ of the fundamental vibration is measured at the temperature $t_1$. Next, the resonator is set to another temperature, which is read and denoted $t_2$, and the resonant frequency $f_2$ of the fundamental vibration is measured at the temperature $t_2$.

Based on the temperatures $t_1$, $t_2$ and the resonant frequencies $f_1$, $f_2$ the first order temperature coefficient $\alpha$ is calculated by the following equation:

$$\alpha = \frac{f_2 - f_1}{t_2 - t_1} \text{ (Hz/°C.)} \quad (1)$$

Moreover, by making use of the nominal frequency $f_0$ to be adjusted, the equation can be rewritten as follows:

$$\alpha = \frac{f_2 - f_1}{f_0} \cdot \frac{1}{t_2 - t_1} \text{ (1/°C.)} \quad (2)$$

Figure 13:
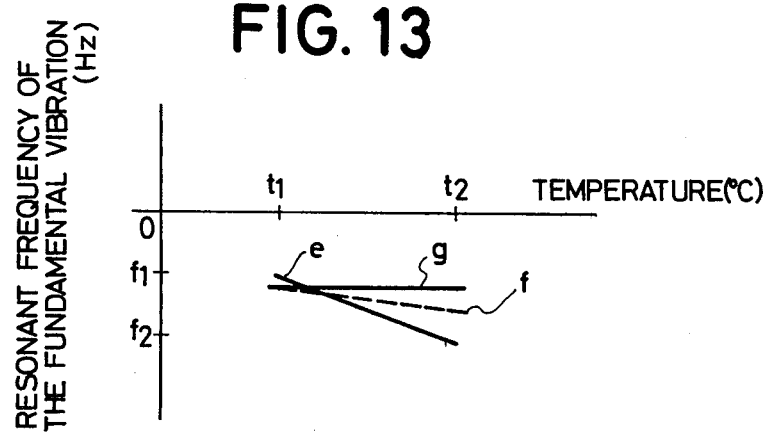
FIG. 13 shows an example of adjusting the temperature characteristics of the GT cut quartz resonator according to the present invention.

FIG. 13 shows an example of ajusting the temperature characteristics of the GT cut quartz resonator according to the present invention. After measuring the resonant frequencies $f_1$, $f_2$ at the temperatures $t_1$, $t_2$, the first order temperature coefficient $\alpha$ is calculated by utilizing the equation (2).

For the example described above, the first order temperature coefficient $\alpha$ is calculated from the temperatures $t_1$, $t_2$ and resonant frequencies $f_1$, $f_2$, and when high measuring accuracy of $\alpha$ is required, such can be done by increasing the number of measurements of temperature and resonant frequency of the fundamental vibration. It goes without saying that it is possible to further raise the measuring accuracy of 60 from calculations using the minimum square method.

In order to adjust the first order temperature coefficient $\alpha$ to near zero, as explained in FIGS. 4 and 5, the weights 10, 11, namely, the weights 24, 25 shown in FIG. 11, are eliminated, as a result, a straight line e shown in FIG. 13 changes to a dotted line f. Moreover, by continuing the adjustment, a straight line g whose first order temperature coefficient is almost zero, is obtained. Then, the resonant frequency of the fundamental vibration approaches to the nominal frequency $f_0$ more and more.

And next, it is possible to adjust the resonant frequency of the fundamental vibration to the nominal frequency $f_0$ at the room temperature by eliminating or reducing or removing the weights 20, 21, 22, 23 without significantly changing the temperature characteristics. Consequently, it is possible to provide a resonator having excellent temperature characteristics, whose resonant frequency of the fundamental vibration is suitably adjusted to the target value, i.e. the nominal frequency. The foregoing explanation pertains to a laser method, but an evaporation method can be used in the same way. That is to say, as the resonator is formed by etching, no weights are disposed on the resonator, which is designed as follows: (1) The first order temperature coefficient $\alpha$ has a positive value, in other words, as the temperature rises the resonant frequency gets higher. (2) The resonant frequency of the fundamental vibration is higher than the nominal frequency to be adjusted.

Such a resonator is also easily obtained by choosing the shape, and etching hours. The resonant frequencies $f_1$, $f_2$ of the fundamental vibration are respectively measured at the arbitrary different temperatures $t_1$, $t_2$.

The first order temperature coefficient $\alpha$ is calculated by making use of the equation (1) or (2). Next, weights are adhered to regions of the resonator where the weights 24, 25 are disposed as shown in FIG. 11. As the first order temperature coefficient $\alpha$ shifts to a negative side by adhering the weights, it is possible to adjust $\alpha$ to near zero. After that, by adhering weights to regions of the resonator corresponding to the weights 20, 21, 22, 23, it is possible to adjust the resonant frequency of the fundamental vibration to the nominal frequency $f_0$ without significantly changing the temperature characteristics. As well as the laser method, it is possible to provide a coupling resonator having excellent temperature characteristics whose resonant frequency of the fundamental vibration is suitably adjusted to the nominal frequency $f_0$.

Figure 14:
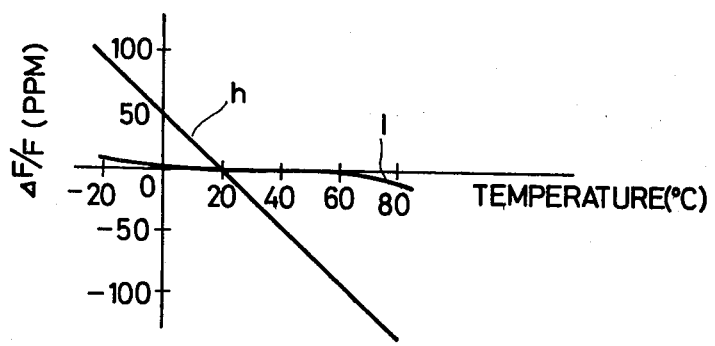
FIG. 14 shows an example of the temperature characteristics of the GT cut quartz resonator of the present invention obtained by the laser method.

FIG. 14 shows an example of the temperature characteristics, wherein a straight line h shows the temperature characteristics before adjusting the resonant frequency by the laser equipment, and a generally straight line I shows the temperature characteristics measured after adjusting the resonant frequency by the laser equipment. It can be seen that excellent temperature characteristics are obtained as shown in FIG. 14.

As described above, in either the case of the laser method or the evaporation method, a coupling resonator having optimum temperature characteristics and optimum resonant frequency is made, and before adjusting the resonant frequency, the resonant frequencies $f_1$, $f_2$ of the fundamental vibration are measured at the arbitrary temperatures $t_1$, $t_2$. Based on these values the first order temperature coefficient $\alpha$ is calculated, then, by utilizing the laser or evaporation equipment the first order temperature coefficient $\alpha$ is adjusted to approximately zero and thereafter, the resonant frequency of the fundamental vibration is adjusted to the nominal frequency $f_0$. As a result, it is possible to provide a GT cut quartz resonator having excellent temperature characteristics. Therefore, the GT cut quartz resonator makes it possible to realize high accuracy wrist watches. As the first order temperature coefficient is adjusted after measuring the temperature characteristics of each resonator in these methods, the percent of resonators having defective temperature characteristics is remarkably reduced. These methods, therefore, make it possible to mass produce resonators while keeping the cost down. The explanation of the present invention adopted the GT cut quartz resonator, and it is understood that the present invention is easily applicable to another coupling resonator, e.g. the FT quartz resonator.

What is claimed is:

1. A method of adjusting the resonant frequency of a resonator having a plurality of coupled vibrational modes which comprises the steps of: measuring the resonant frequency of the fundamental vibration at a plurality of different temperatures; calculating a frequency-temperature coefficient of the first order $\alpha$ by use of said different temperatures and respective resonant frequencies of the fundamental vibration; adding weights to or removing weights from the vibrational portion of the resonator at a first predetermined portion thereof so as to adjust the first order temperature coefficient $\alpha$ to almost zero; and thereafter adding weights to or removing weights from the vibrational portion at a second predetermined portion thereof so as to adjust the resonant frequency of the fundamental vibration in such manner that the frequency-temperature coefficient of the first order $\alpha$ hardly shifts.

2. A method of adjusting the resonant frequency of a resonator as claimed in claim 1; wherein the second predetermined portion comprises the vicinity of the center between the edge in the length direction and the center in the length direction of the vibrational portion.

3. A method of adjusting the resonant frequency of a resonator as claimed in claim 2; wherein the first predetermined portion comprises the vicinity of the center in the length direction of the vibrational portion.

4. A method of adjusting the resonant frequency of a resonator as claimed in claim 1; wherein the first predetermined portion comprises the vicinity of the center in the length direction of the vibrational portion.

5. A method of adjusting the resonant frequency of a resonator as claimed in claim 1; wherein the resonator is a GT cut quartz resonator.

6. A method of adjusting the resonant frequency of a resonator having a plurality of vibrational modes which comprises the steps of: setting the resonator at an arbitrary temperature $t_1$; measuring the resonant frequency $f_1$ of a fundamental vibration of the resonator at the arbitrary temperature $t_1$; thereafter setting the resonator at another temperature $t_2$; measuring the resonant frequency $f_2$ of said fundamental vibration at the temperature $t_2$; calculating a frequency-temperature coefficient of the first order $\alpha$ by use of the temperatures $t_1$, $t_2$ and the respective resonant frequencies $f_1$, $f_2$; adding weights to or removing weights from the vibrational portion of the resonator at locations effective to adjust the first order temperature coefficient $\alpha$ to almost zero; and thereafter adding weights to or removing weights from the vibrational portion of the resonator at predetermined portions thereof effective to adjust the resonant frequency of the fundamental vibration in such manner that the frequency-temperature coefficient of the first order $\alpha$ hardly shifts.

7. A method for adjusting the resonant frequency of a coupling resonator comprising the steps of: providing a coupling resonator having a resonant portion vibratable in at least two coupled together modes of vibration including a fundamental mode and a sub mode; adjusting the first order frequency-temperature coefficient of the resonator to near zero by the addition of reduction of weights on the resonant portion; and thereafter adjusting the resonant frequency of the fundamental mode of vibration by the addition or reduction of weights on the resonant portion without significantly disturbing the previously adjusted first order frequency-temperature coefficient.

8. A method for adjusting the resonant frequency of a coupling resonator according to claim 7; wherein the providing step comprises providing a coupling resonator having a generally rectangular resonant portion having opposed major surfaces and a first pair of opposed sides and a second pair of opposed sides; and the step of adjusting the first order frequency-temperature coefficient comprises adding or reducing weights on at least one major surface of the resonant portion along the marginal edge portions of the first pair of sides at locations approximately midway along the length of the sides.

9. A method for adjusting the resonant frequency of a coupling resonator according to claim 8; wherein the step of adjusting the resonant frequency comprises adding or reducing weights on at least one major surface of the resonant portion along the marginal edge portions of the first pair of sides at locations between the midpoint and the two ends of both of the sides.

10. A method for adjusting the resonant frequency of a coupling resonator according to claim 9; wherein the providing step comprises providing a GT cut quartz resonator.

11. A method for adjusting the resonant frequency of a coupling resonator according to claim 7; wherein the providing step comprises providing a coupling resonator having a generally rectangular resonant portion having opposed major surfaces and a first pair of opposed sides and a second pair of opposed sides; and wherein the step of adjusting the resonant frequency comprises adding or reducing weights on at least one major surface of the resonant portion along the marginal edge portions of the first pair of sides at locations between the midpoint and the two ends of both of the sides.

12. A method for adjusting the resonant frequency of a coupling resonator according to claim 11; wherein the providing step comprises providing a GT cut quartz resonator.

13. A method for adjusting the resonant frequency of a coupling resonator according to claim 7; wherein the step of adjusting the first order frequency-temperature coefficient of the resonator includes measuring the resonant frequency of the fundamental mode of vibration of the resonator at a plurality of different temperatures, calculating the first order frequency-temperature coefficient by use of the different temperatures and the respective measured resonant frequencies, and thereafter adjusting the first order frequency-temperature coefficient to near zero by the addition or reduction of weights on the resonant portion.

* * * * *